(12) United States Patent
Takanashi (10) Patent No.: US 8,801,853 B2
(45) Date of Patent: Aug. 12, 2014

(54) MECHANISM FOR CONTROLLING MELT LEVEL IN SINGLE CRYSTAL PULLING APPARATUS, METHOD FOR CONTROLLING MELT LEVEL IN SINGLE CRYSTAL PULLING APPARATUS, MECHANISM FOR ADJUSTING MELT LEVEL IN SINGLE CRYSTAL PULLING APPARATUS AND METHOD FOR ADJUSTING MELT LEVEL WHILE PULLING SINGLE CRYSTAL

(75) Inventor: Keiichi Takanashi, Tokyo (JP)

(73) Assignee: Sumco Corporation (JP)

( * ) Notice: Subject to any disclaimer, the term of this patent is extended or adjusted under 35 U.S.C. 154(b) by 1147 days.

(21) Appl. No.: 11/488,382

(22) Filed: Jul. 17, 2006

(65) Prior Publication Data

US 2007/0017435 A1    Jan. 25, 2007

(30) Foreign Application Priority Data

Jul. 22, 2005   (JP) ................. 2005-213233

(51) Int. Cl.
*C30B 15/02* (2006.01)

(52) U.S. Cl.
USPC ............... 117/14; 117/15; 117/213; 117/214; 117/201; 117/202

(58) Field of Classification Search
USPC ............... 117/14, 15, 213, 214, 201, 202
See application file for complete search history.

(56) References Cited

U.S. PATENT DOCUMENTS

| | | | | |
|---|---|---|---|---|
| 4,350,557 A | * | 9/1982 | Scholl et al. ............ | 117/15 |
| 4,915,775 A | | 4/1990 | Katsuoka et al. | |
| 5,183,528 A | * | 2/1993 | Baba et al. ............ | 117/15 |
| 5,437,242 A | * | 8/1995 | Hofstetter et al. ............ | 117/14 |
| 6,241,818 B1 | * | 6/2001 | Kimbel et al. ............ | 117/13 |
| 7,264,674 B2 | * | 9/2007 | Takanashi et al. ............ | 117/15 |

FOREIGN PATENT DOCUMENTS

| | | |
|---|---|---|
| JP | S62-087481 | 4/1987 |
| JP | H01-024089 | 1/1989 |
| JP | 64-069591 | 3/1989 |
| JP | H06-116083 | 4/1994 |
| JP | 2002-087899 | 3/2002 |
| JP | 2005-187291 | 7/2005 |

OTHER PUBLICATIONS

Patent Office of Japan; "Notice of Reasons for Rejection" for JP 2005-213233; mailing date Sep. 8, 2009; includes English-language translation prepared by Applicant; 9 pages total. JP 2005-213233 is a foreign counterpart of this U.S. application.

* cited by examiner

*Primary Examiner* — Bob M Kunemund
(74) *Attorney, Agent, or Firm* — Kolisch Hartwell, P.C.

(57) ABSTRACT

This mechanism for controlling a melt level includes: an optical recording device by which a real image of a furnace internal structural object and a reflected image reflected on the melt surface; and a processing device which, taking a value based on the real image as a reference value, controls the position of the melt surface based on a relationship of a position or a size of the reflected image, a distance between the reflected image and the real image, or amounts of changes thereof to the position of the melt surface. This mechanism for adjusting a melt level includes: the above mechanism for controlling a melt level; and a lifting mechanism which is controlled by the mechanism for controlling a melt level and adjusts the melt surface to the set position.

12 Claims, 4 Drawing Sheets

MECHANISM FOR CONTROLLING MELT LEVEL IN SINGLE CRYSTAL PULLING APPARATUS, METHOD FOR CONTROLLING MELT LEVEL IN SINGLE CRYSTAL PULLING APPARATUS, MECHANISM FOR ADJUSTING MELT LEVEL IN SINGLE CRYSTAL PULLING APPARATUS AND METHOD FOR ADJUSTING MELT LEVEL WHILE PULLING SINGLE CRYSTAL

BACKGROUND OF THE INVENTION

1. Field of the Invention

The present invention relates to a mechanism for controlling a melt level in a single crystal pulling apparatus, a method for controlling a melt level in a single crystal pulling apparatus, a mechanism for adjusting a melt level in a single crystal pulling apparatus, and a method for adjusting a melt level while pulling a single crystal that make it easy to control the position of the melt surface prior to or during a crystal growth in a single crystal pulling furnace using the Czochralski method (hereinafter, this may be referred to as the CZ method) for manufacturing single crystals of materials for semiconductor devices.

This application claims priority from Japanese Patent Application No. 2005-213233 filed on Jul. 22, 2005, the content of which is incorporated herein by reference.

2. Background Art

Figure 1:
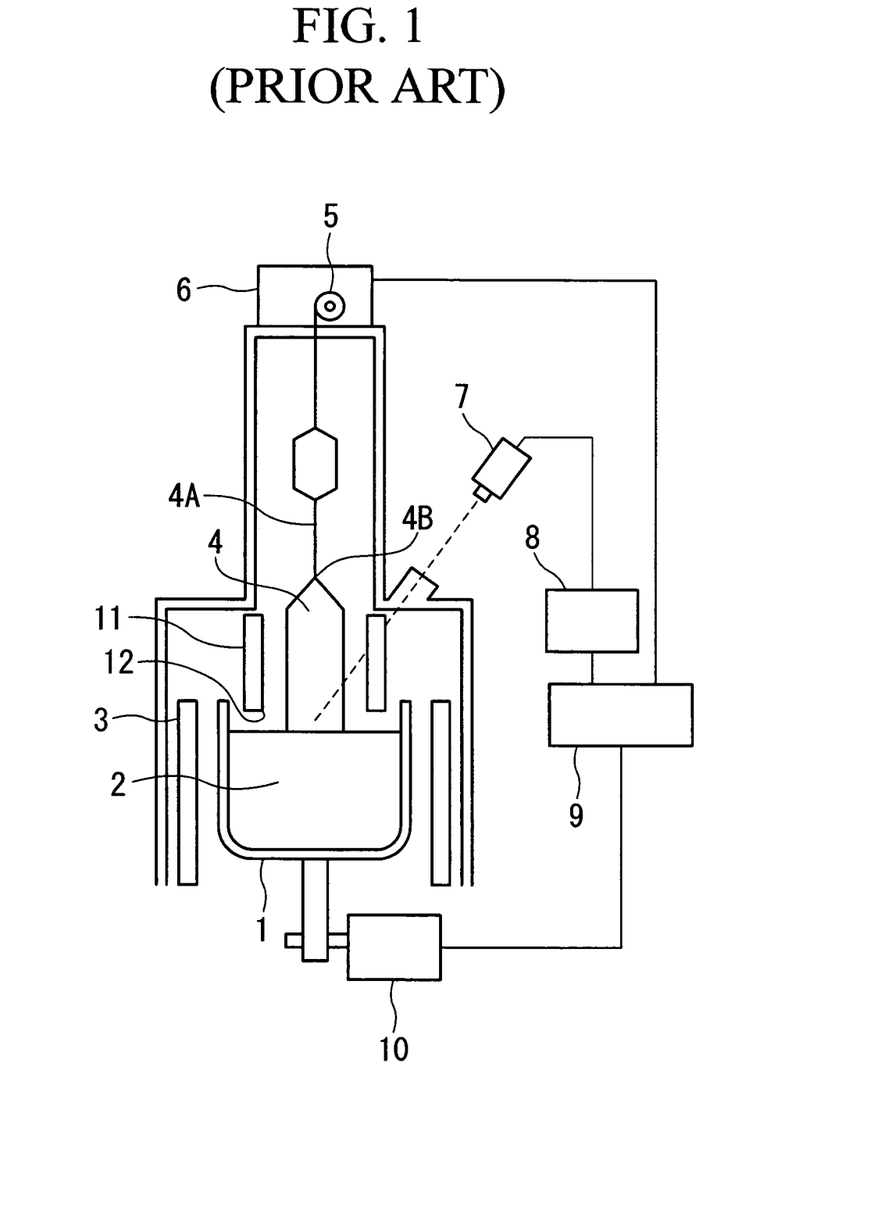
FIG. 1 is a schematic structural view showing a conventional single crystal pulling apparatus.

Various methods exist for pulling single crystals of materials for semiconductor devices, and the Czochralski method is one of these. FIG. 1 shows an example of a single crystal pulling apparatus that employs the Czochralski method. In FIG. 1, the symbol 1 is a crucible. Raw material for semiconductors is contained in the crucible 1 in the form of a melt 2. The symbol 3 is a heater. The melt 2 inside the crucible 1 is kept in a molten state by this heater 3. The symbol 4 is a single crystal shown as it is being pulled. A seed crystal 4B fixed at the distal end of a wire 4A is placed in contact with the surface of the melt 2, and then the single crystal 4 is pulled. The symbol 5 is a pulling apparatus. The single crystal 4 is gradually pulled by the pulling apparatus 5 via the wire 4A and the seed crystal 4B. The symbol 6 is a rotation apparatus. The single crystal 4 is rotated together with the pulling apparatus 5 by the rotation apparatus 6. The symbol 7 is a camera. The melt 2 inside the crucible 1 is photographed by the camera 7. The symbol 8 is an image processing device. Image data photographed by the camera 7 is processed by the image processing device 8. The symbol 9 is a control unit. The pulling apparatus 5 and the rotation apparatus 6 and the like are controlled by the control unit 9. The symbol 10 is a drive motor. The crucible 1 is moved up and down by the drive motor 10 so that the surface of the melt 2 is moved up and down. The symbol 11 is a heat shield. This heat shield 11 is provided so as to surround the single crystal 4 and to also insulate and maintain the temperature of the single crystal 4. Note that a lifting mechanism includes the control unit 9 and the drive motor 10.

The CZ method is a process in which the single crystal 4 is pulled from the melt 2 in the crucible 1 by the pulling apparatus 5 while being rotated by the rotation apparatus 6. At this time, in order to obtain a silicon single crystal of good quality continuously, for each batch, it is necessary to control the position of the melt such that the surface position of the melt 2 is kept constant relative to the heater 3.

In order to control the position of the melt such that the position of the melt surface is kept to a constant position in the initial stages of the single crystal pulling, the following methods are conventionally used.

A method (Patent Document 1) in which a non-combustible rod made of quartz or the like that is attached to the distal end of a furnace internal structural object is placed and the position of the melt surface is verified by lifting a crucible such that a melt in the crucible is in contact with the non-combustible rod;

a method (Patent Document 2) in which the position of the melt surface is verified by making a seed crystal in contact with the melt surface; and a method (Patent Document 3) in which the position of the melt surface is verified by comparing reference marks and reflection images thereof with pre-recorded images or by making a direct calculation from the image data.

In Patent Documents 1 and 2, errors in the length of the non-combustible rods and the seed crystals, as well as errors made when confirming the contact with the melt that are due to the movement of the melt and the like create problems, and it is difficult to accurately set the position of the surface in the initial stages.

In Patent Document 3, in the case in which the image data photographed by the camera is compared in an unmodified manner with the comparison image data, or in the case in which a distance between the reference mark and the melt is directly calculated from the image data, errors in the camera mounting position and the like also remain and the accuracy is poor.

It is also possible to apply a measuring method such as laser triangulation or the like; however, in this case, the measuring apparatus itself is expensive, and it is necessary to provide a dedicated window for measuring purpose in the furnace body which also causes high equipment expenses.

The present invention was conceived in view of the problems in these conventional methods, and it is an object thereof to provide a mechanism for controlling a melt level (position of a melt surface) in a single crystal pulling apparatus, a method for controlling a melt level in a single crystal pulling apparatus, a mechanism for adjusting a melt level in a single crystal pulling apparatus, and a method for adjusting a melt level while pulling a single crystal that make it possible using existing equipment to easily and accurately adjust the position of the melt surface to a set position.

(Patent Document 1) Japanese Patent No. 1676655
(Patent Document 2) Japanese Patent No. 2132013
(Patent Document 3) Japanese Patent Application, Publication No. H06-116083

SUMMARY OF THE INVENTION

The mechanism for controlling a melt level in a single crystal pulling apparatus of the present invention controls a position of a melt surface (a melt level or surface position of a melt) in order to pull single crystals from the melt surface using the Czochralski method. The mechanism includes: an optical recording device which obtains image information by photographing a real image of a furnace internal structural object and a reflected image of the furnace internal structural object that is reflected on the melt surface; and a processing device which, taking a value that is based on the real image as a reference value, controls the position of the melt surface based on a relationship of a position of the reflected image, a size of the reflected image, a distance between the reflected image and the real image, or amounts of changes thereof to the position of the melt surface or the amount of movement of the melt surface, and the relationship is calculated in advance from the image information.

In the mechanism for controlling a melt level in a single crystal pulling apparatus of the present invention, in the processing device, the position of the real image in the image information may be taken as the reference value, and the position of the melt surface may be controlled based on a relationship between the position of the reflected image or the amount of change thereof and the position of the melt surface or the amount of movement of the melt surface which is calculated in advance from the image information.

In the processing device, the size of the real image in the image information may be taken as the reference value, and the position of the melt surface may be controlled based on a relationship of the size of the reflected image or the amount of change thereof to the position of the melt surface or the amount of movement of the melt surface which is calculated in advance from the image information.

In the processing device, zero which is the value of the distance when the real image is in contact with the reflected image, may be taken as the reference value, and the position of the melt surface may be controlled based on a relationship of the distance between the real image and the reflected image or the amount of change thereof to the position of the melt surface or the amount of movement of the melt surface which is calculated in advance from the image information.

The relationship may be calculated by measuring the distances and positions of the melt surface that correspond thereto in the image information at three or more positions of the melt surface, and then approximating these values to a curved line or straight line.

The furnace internal structural object may have a circular shape or an elliptical shape, a center point of the furnace internal structural object may be calculated by a circular approximation, and the calculated center point may be used as a point for measurement in order to specify the distance between the real image and the reflected image.

Differential images may be used when in the image information, measuring the distance between the real image of the furnace internal structural object and the reflected image that is reflected on the melt surface.

The method for controlling a melt level in a single crystal pulling apparatus of the present invention controls a position of a melt surface in order to pull single crystals from the melt surface using the Czochralski method. The method includes: at a plurality of movement positions of the melt surface which are positioned by moving the melt surface vertically, obtaining image information by photographing a real image of a furnace internal structural object and a reflected image thereof that is reflected on the melt surface; taking a value that is based on the real image as a reference value, measuring a position of the reflected image, a size of the reflected image, a distance between the reflected image and the real image, or amounts of changes thereof from the image information; calculating a relationship between the value of the measurement and a position of the melt surface or amount of movement by the melt surface; and while pulling a single crystal from the melt surface, controlling the position of the melt surface based on the relationship.

In the method for controlling a melt level in a single crystal pulling apparatus of the present invention, taking the position of the real image in the image information as the reference value, a relationship may be calculated between the position of the reflected image or the amount of change thereof and the position of the melt surface or the amount of movement by the melt surface, and when a single crystal is pulled from the melt surface, the position of the reflected image may be measured from the image information, and the position of the melt surface may be controlled based on the value of the measurement and on the relationship.

Taking the size of the real image in the image information as the reference value, a relationship may be calculated between the size of the reflected image or the amount of change thereof and the position of the melt surface or the amount of movement by the melt surface, and when a single crystal is pulled from the melt surface, the size of the reflected image may be measured from the image information, and the position of the melt surface may be controlled based on the value of the measurement and on the relationship.

Taking zero which is the value of the distance when the real image is in contact with the reflected image as the reference value, a relationship may be calculated between the distance between the real image and the reflected image or the amount of change thereof and the position of the melt surface or the amount of movement by the melt surface, and when a single crystal is pulled from the melt surface, the distance between the real image and the reflected image or the amount of change thereof may be measured from the image information, and the position of the melt surface may be controlled based on the value of the measurement and on the relationship.

The relationship may be calculated by measuring the distances and positions of the melt surface that correspond thereto in the image information at three or more positions of the melt surface and then approximating these values to a curved line or straight line.

The furnace internal structural object may have a circular shape or an elliptical shape, a center point of the furnace internal structural object may be calculated by a circular approximation, and the calculated center point may be used as a point for measurement in order to specify a distance between the real image and the reflected image.

Differential images may be used when in the image information measuring the distance between the real image of the furnace internal structural object and a reflected image that is reflected on the melt surface.

The mechanism for adjusting a melt level in a single crystal pulling apparatus of the present invention adjusts a position of a melt surface to a set position in order to pull single crystals from the melt surface using the Czochralski method. The mechanism includes: the mechanism for controlling a melt level of the present invention; and a lifting mechanism which is controlled by the mechanism for controlling a melt level and adjusts the melt surface to the set position by raising or lowering a crucible in which the melt is held.

The method for adjusting a melt level of the present invention adjusts a position of a melt surface to a set position while pulling a single crystal in order to pull single crystals from the melt surface using the Czochralski method. The method includes: raising or lowering a crucible in which the melt is held so as to adjust the position of the melt surface to the set position using the method for controlling a melt level in a single crystal pulling apparatus of the present invention.

In accordance with the present invention, using an optical recording device such as an existing camera or the like that is installed outside a furnace, it is possible to easily and accurately adjust a position of a melt surface without making any modifications to the furnace body. Moreover, a melt surface can be easily and accurately matched to an initial position of the melt surface.

PREFERRED EMBODIMENTS

First Embodiment

Embodiments of the present invention are described below with reference made to the appended drawings. Note that the structure of the single crystal pulling apparatus of the present embodiment has the same basic configuration as that of a conventional single crystal pulling apparatus. Accordingly, the same symbols are used for the same components and a description thereof is omitted.

Figure 2:
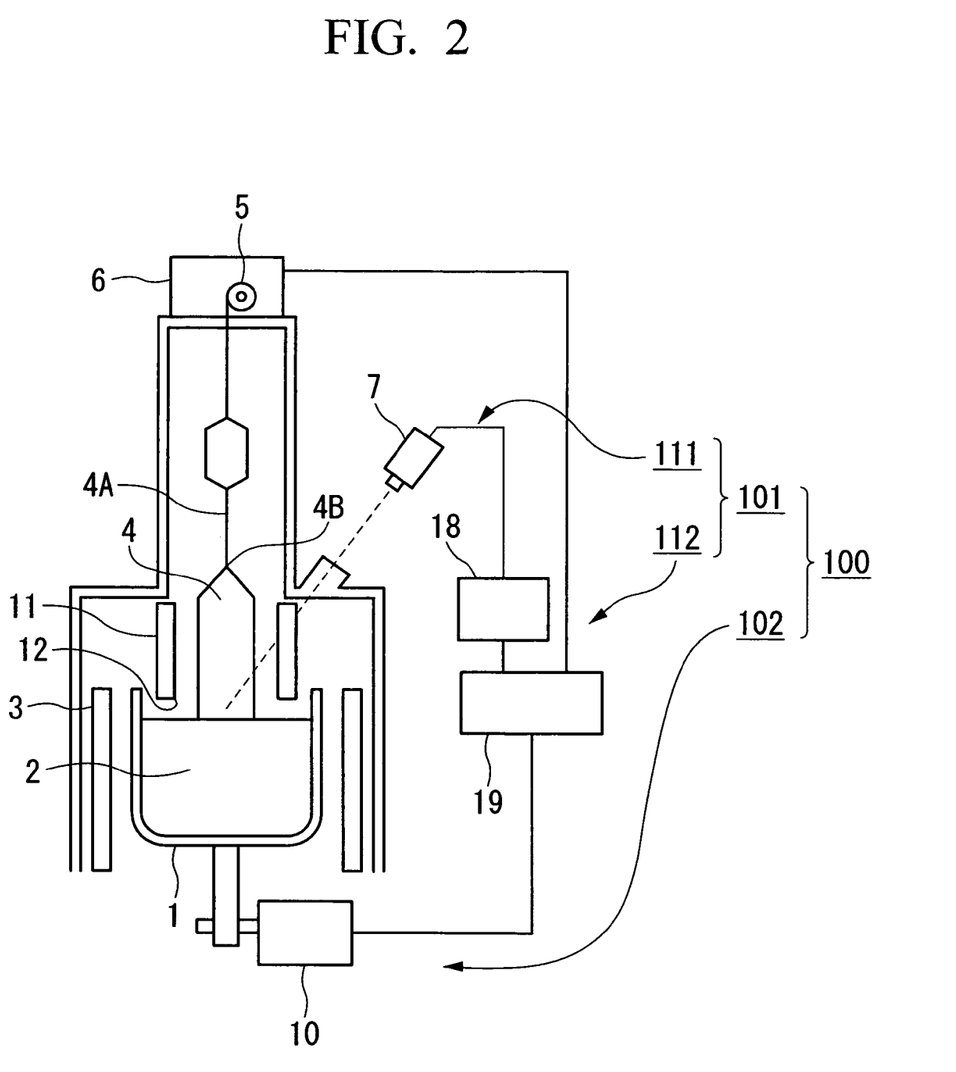
FIG. 2 is a schematic structural view showing a single crystal pulling apparatus having a mechanism for adjusting a melt level of the present invention.

FIG. 2 is a schematic structural view showing an example of a single crystal pulling apparatus having a mechanism for adjusting a melt level of the present invention. This mechanism for adjusting a melt level 100 for this single crystal pulling apparatus is provided with a mechanism for controlling a melt level 101 and a lifting mechanism 102. The mechanism for controlling a melt level 101 is provided with an optical recording device 111 and a processing device 112. The optical recording device 111 includes a camera 7, and the processing device 112 includes an image processing unit 18 and a control unit 19. The lifting mechanism 102 has a drive motor 10.

A real image of the furnace internal structural object and a reflected image that is reflected on the melt surface are photographed by the camera 7. Image information such as these photographs and dynamic images and the like is sent to the image processing unit 18 and a distance between the real image and the reflected image is measured by the image processing unit 18. Measured values for the distance between the real image and the reflected image are sent to the control unit 19. In the control unit 19, adjustment amounts for the position of the surface of the melt 2 (i.e., for the melt level) are calculated in order for the position of the surface of the melt 2 to remain constantly at a target position. In the present embodiment, a position at which the distance between the real image and the reflected image is zero (i.e., a position at which the furnace internal structural object touches the surface of the melt 2) is taken as a reference position, and based on a relationship between the distance between the real image and the reflected image and the position of the melt surface in the vertical direction that has been determined in advance, an amount by which the position of the surface of the melt 2 (i.e., the melt level) is to be adjusted is calculated using the measured value of the distance between the real image and the reflected image. A signal that corresponds to this adjustment amount is then output to the drive motor 10. The crucible 1 is then raised or lowered by the drive motor 10 based on the signal that is output from the control unit 19. As a result of the above, when a single crystal is pulled from a melt surface using the Czochralski method, the position of the melt surface is made to remain constantly at a target position.

The single crystal pulling apparatus of the present embodiment makes it possible to more easily and accurately adjust the position of the surface of the melt 2 inside the crucible 1 using an existing single crystal pulling apparatus. Specifically, the control unit 19 performs a control method which is an improvement of a conventional method. This control method will now be described in detail.

Figure 3:
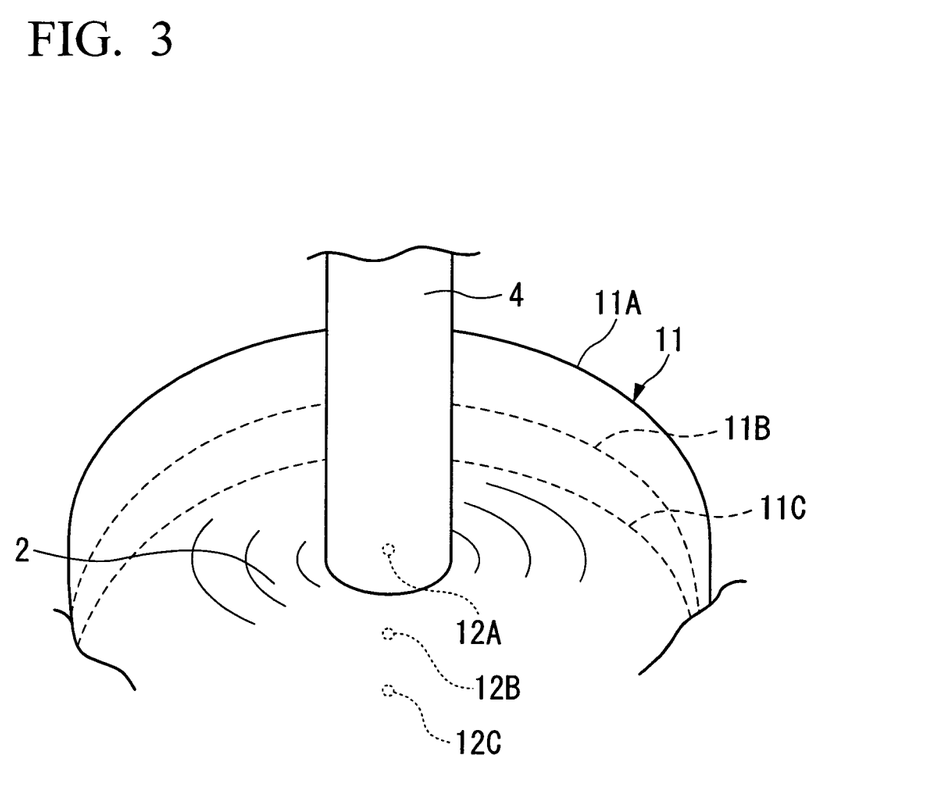
FIG. 3 is a perspective view showing the state of changes of an actual image of a furnace internal structural object and a reflected image that is reflected on a melt surface when the surface of the melt is moved.

FIG. 3 is a perspective view showing a state inside a pulling furnace. Since the surface of the silicon melt 2 is a reflective surface, a furnace internal structural object is reflected on this surface. Note that the furnace internal structural object is a member that is provided at a position facing the melt 2 inside the crucible 1 in the interior of the furnace. This furnace internal structural object is fixed to a side of the furnace and the shape, dimensions, and position thereof remain constant and unchanged relative to the movement in the vertical direction of the crucible 1 during the pulling of a single crystal. Because of this, even if the melt 2 is moved up or down by the vertical movement of the crucible 1, there is no variation in the furnace internal structural object and a reflected image thereof is reflected on the surface of the melt 2. An existing object may be used for the furnace internal structural object or a new member may be provided. Here, the heat shield 11 is used. The heat shield 11 has an aperture portion 12 and is shaped like a circular cylinder that extends in the direction in which the single crystals are pulled. The heat shield 11 is provided so as to surround the periphery of the pulled single crystal 4 after it has solidified.

When the crucible 1 is raised or lowered so that the position of the surface of the melt 2 (i.e., melt level) is moved vertically, the distance between the real image of the heat shield 11 and the reflected image that is reflected on the surface of the melt 2 changes in conjunction with this vertical movement. Theoretically, a proportional relationship exists between the distance between the real image and the reflected image and the distance between the furnace internal structural object and the surface of the melt 2. Because the furnace internal structural object is fixed and the distance between the furnace internal structural object and the surface of the melt 2 is in proportion to the position of the surface of the melt 2, a proportional relationship exists between the above-described distance and the position of the surface of the melt 2. The position of the surface of the melt 2 can be represented as the amount of vertical movement (i.e., the position in the vertical direction relative to the reference position) from the reference position of the melt 2 or the crucible 1.

Theoretically, a proportional relationship also exists between a value of the distance between the real image and the reflected image calculated from the image information photographed by the camera 7 (this is a measured value and may be, for example, the number of pixels in the image), and the amount of vertical movement (i.e., the relative position in the vertical direction) of the melt 2 that moves vertically when the crucible 1 is moved vertically by the drive motor 10. In actual fact, this relationship is often one that can be approximated to a secondary or greater curve.

In the present embodiment, firstly, the following task is performed prior to the pulling of a single crystal from the melt 2 and with the precondition that the liquid quantity of the melt 2 is kept constant. Taking a position at which the distance between the real image and the reflected image is zero (i.e., a position at which the heat shield 11 is in contact with the surface of the melt 2) as a reference position for the surface of the melt 2, the surface of the melt 2 is moved vertically, and the respective distances between the real image of the heat shield 11 and the reflected image thereof that is reflected on the surface of the melt 2 are measured at a plurality of positions of the melt surface of the melt 2 (i.e., positions relative to the reference position). In addition, a relationship between the measured values of the distances between the real image and reflected image and the positions of the melt surface of the melt 2 is calculated and specified. By then employing the relationship, it is possible to indirectly specify the position of the surface of the melt 2 from the distance between the real image and the reflected image of the heat shield 11.

Next, the distance between the real image and the reflected image at the initial position of the surface of the melt 2 (i.e., the position of the surface that is being kept constant during the pulling of the single crystal, namely, the target position) is specified in advance in the image information of the camera 7.

While the single crystal is being pulled, the real image and the reflected image are then photographed by the camera 7 and the distance between the real image and the reflected image is then measured from the obtained image information. Because the melt 2 is consumed as the single crystal grows so that the position of the surface of the melt 2 changes, the distance between the real image and the reflected image also changes. Based on the above described relationship, the position of the surface of the melt 2 is adjusted such that the measured values of the distance between the real image and the reflected image are the same as those of the distance for the initial position of the surface (i.e., the target position). As a result of the above, it is possible to match (i.e., and to maintain) the position of the surface of the melt 2 to the initial position of the melt surface.

If a real image of the heat shield 11 and a reflected image thereof are photographed by the camera 7 that is installed outside the furnace, errors may be contained in the obtained values of the distance between the real image and the reflected image due to errors in the installation state of this camera 7 (i.e., errors in the installation position, tilt and the like). Because of this, it is difficult to establish an accurate position of the surface when the distance between the real image and the reflected image is calculated purely from the image data photographed by the camera 7.

In contrast, by vertically moving the position of the melt 2, the distance between the real image and the reflected image of the heat shield 11 is changed. The changes in the distances at a plurality of positions of the melt surface are then measured, and the position of the melt surface is specified indirectly from the changes in the distance. Specifically, using the above described relationship, the position of the melt surface is calculated from the measured values of the distances between the real image and the reflected image. As a result, it is possible to remove any influence from the camera installation position. Namely, any errors in the tilt of the camera 7 or any errors in the mounting position of the camera 7 can be removed.

A specific illustration is given below.

When the heat shield 11 touches the surface of the melt 2, the distance between the real image of the heat shield 11 and the reflected image thereof is zero (i.e., is at the reference position for the surface of the melt 2). If the crucible 1 is lowered so that the melt 2 moves away from the heat shield 11, the distance between the real image of the heat shield 11 and the reflected image thereof becomes large. FIG. 3 shows a center point 12A of a real image 11A of the heat shield 11 and center points 12B and 12C of reflected images 11B and 11C that were obtained by taking measurements in two positions as the crucible 1 was being lowered. At this time, the positions of the surface of the melt 2 (i.e., the positions of the crucible 1 that was moved vertically by the drive motor 10) at which the center points 12B and 12C of the reflected images 11B and 11C were measured are specified from the amount of movement of the crucible 1 in the control unit 19 that controls the drive motor 10. The distances between the center points 12B and 12C of the reflected images 11B and 11C are calculated using the number of pixels or the like from image information photographed by the camera 7. Because of this, the distance is an indirect size that is obtained not by accurately measuring the actual size, but by using the number of pixels in the image information photographed by the camera 7.

Note that the center point of the heat shield 11 is obtained by making a circular approximation of the edge of the aperture portion 12 of the heat shield 11 and then taking the center point thereof. Moreover, the center point of the reflected image of the heat shield 11 that is reflected on the surface of the melt 2 is also obtained by making a circular approximation of the mirror image of the edge and then taking the center point thereof. The distance between the real image and the reflected image is then specified using the center position of the heat shield 11 that has been determined in this manner as a reference.

When detecting the edge of the heat shield 11, normally, a binarization process is used in which threshold values are set based on the brightness value of the edge of the heat shield 11. However, in this case, if the temperature inside the furnace changes, the position of the edge being detected also changes and errors arise in the measurement. Because of this, in the present embodiment, differential images are used in the edge detection. In the differential images, the amount of change in the brightness of the original image is displayed as data. In this differential image data, a maximum value is taken at edge portions of the real image of the heat shield 11 and the reflected image thereof so that the size of the brightness of the original image becomes irrelevant. Therefore, by taking the position of the maximum value of a differential image as the detection edge, any measurement errors can be reduced even if the temperature inside the furnace changes, and the position of the aperture portion 12 of the heat shield 11 can be specified accurately.

Figure 4:
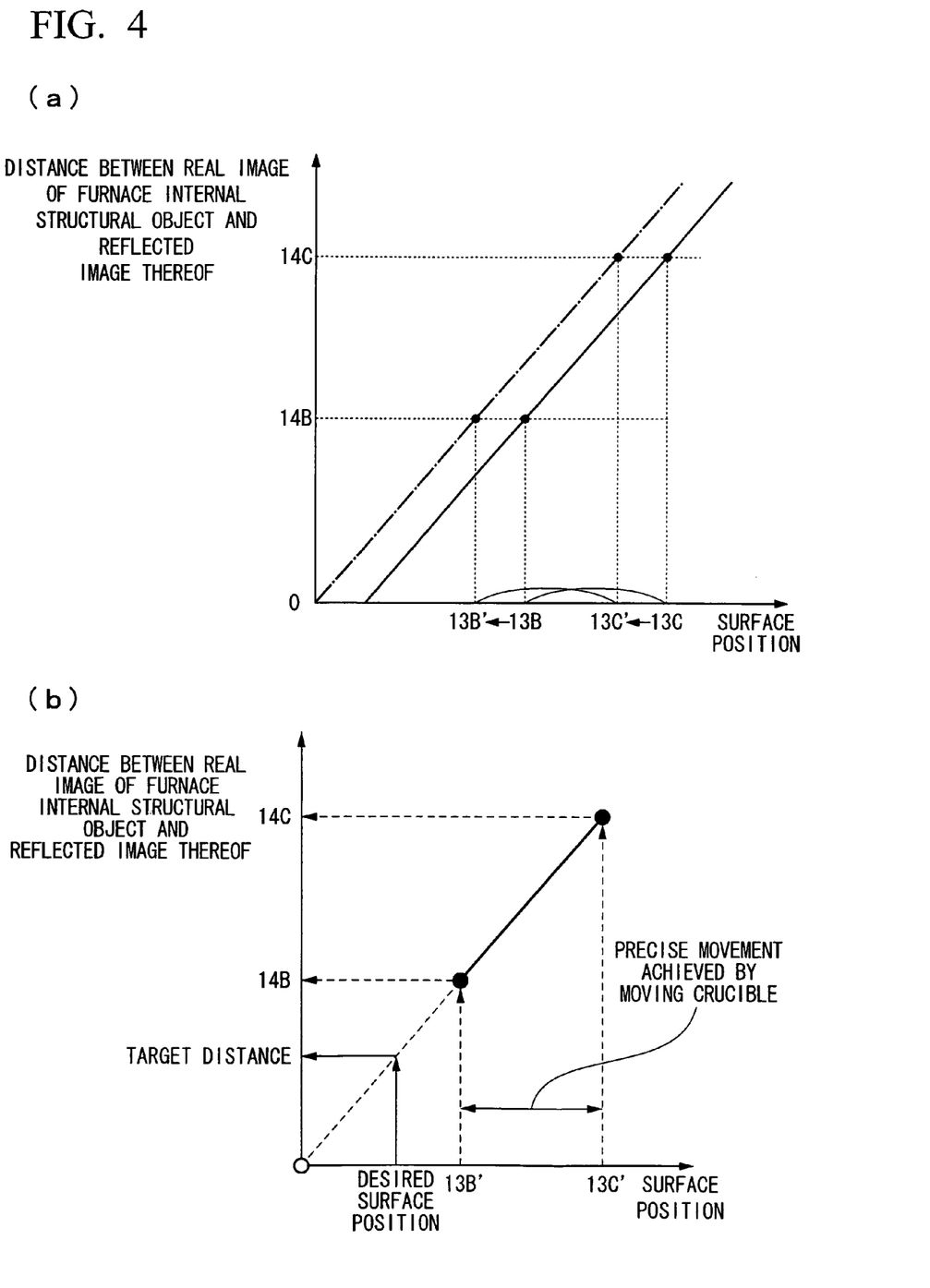
FIG. 4 is a graph showing relationships between a distance between central positions of an actual image of a furnace internal structural object and a reflected image thereof and a position of the melt surface.

FIG. 4 shows a relationships between distances between an actual image 11A of the heat shield 11 and reflected images 11B and 11C thereof and the position of the surface of the melt 2 (i.e., the melt level). In the graph in FIG. 4, the distance between the center point 12A of the real image and the center points 12B and 12C of the two reflected images 11B and 11C forms the vertical axis, while the position of the surface of the melt 2 at which the reflected images 11B and 11C are obtained forms the horizontal axis. The amount of movement when the position of the surface of the melt 2 is moved from the position at which the reflected image 11B is obtained to the position at which the reflected image 11C is obtained, namely, the amount of movement when the position of the surface of the melt 2 is moved from the center point 12B of the reflected image 11B to the center point 12C of the reflected image 11C (i.e., the distance between the center points 12B and 12C) is specified from the output signal from the control unit 19 for controlling the drive motor 10. This graph shows a proportional relationship between the distances between the real image 11A and its reflected images 11B and 11C and the position of the melt surface that is expressed linearly.

Firstly, as is shown in FIG. 4(a), two points that have the distance between the center point 12B of the reflected image 11B and the center point 12C of the reflected image 11C between them are plotted at optional positions on the horizontal axis and are established as relative positions 13B and 13C of the surface at which the reflected images 11B and 11C are obtained respectively. The distance 14B between the center point 12A of the real image 11A and the center point 12B of the reflected image 11B, and the distance 14C between the center point 12A of the real image 11A and the center point 12C of the reflected image 11C are then plotted on the vertical axis with the zero point of the graph taken as the reference point. While maintaining the angle of inclination of a straight line connecting two coordinates on the graph (13B, 14B) and (13C, 14C), the relative position of the surface (13B, 13C) is then translated in parallel (i.e., the alternate long and short dash line in the graph) such that this straight line passes through the zero point of the graph. The relative positions on the graph after this movement are taken as 13B' and 13C'. As a result, as is shown in FIG. 4(b), a correspondence (in this example, a linearly expressed proportional relationship) between the distances between the real image 11A and the reflected images 11B and 11C and the position of the surface of the melt 2 is specified.

In the case in which the relationship between the distance between the real image and the reflected image and the position of the surface of the melt 2 is expressed as a linear function, measurement errors by the camera 7 and the like that are contained in the measured values of the distances between the real image and the reflected images are compensated in the value of the inclination of this linear function. Therefore, accurate adjustment of the position of the melt surface can be performed by using the obtained relationship.

Note that the amount of movement required for the position of the melt surface to reach the reference position may be measured, and the differences between the amounts of movements required to reach the positions of the melt surface at which the reflected images 11B and 11C are obtained and the amount of movement required to reach the reference position may be taken as the relative positions 13B and 13C of the surface at which the reflected images 11B and 11C are obtained respectively.

It is not common for the relationship between the distance between the real image and the reflected image and the position of the surface of the melt 2 to be in a proportional relationship such as that shown in FIG. 4, but actually is often to be in a correspondence that approximates a quadratic curve. In this case, the differences between the amounts of movements required to reach the positions of the melt surface at which the reflected images 11B and 11C are obtained and the amount of movement required to reach the reference position is taken as the relative positions 13B and 13C of the surface at which the reflected images 11B and 11C are obtained respectively. In addition, the distance between the real image and the reflected image and the position of the melt surface are plotted on a graph. And then, they are approximated to a quadratic curve using an approximation method such as the least-square method, and a relationship between the position of the melt surface and the distance between the real image and the reflected image is calculated. Here, when calculating this relationship, the zero that is the value of the distance when the real image and the reflected image are in contact is used as the reference value. Specifically, if the point when the position of the melt surface is at the reference position is taken as the point when the position of the melt surface is zero, the relationship is calculated such that it passes through the point of origin (0, 0). Examples of the method that may be used include a method in which the quadratic curve is approximated using the measured values together with the point of origin, and a method in which the quadratic curve is approximated using the measured values and then the quadratic curve is translated in parallel such that it passes through the point of origin thereby enabling a relationship between the distance between the real image and the reflected image and the position of the melt surface to be obtained. As a result, a relationship in which measurement errors are suppressed is obtained.

Because it is reasonably common for the characteristics of each single crystal pulling apparatus to be different from those of others, a relational expression is selected in accordance with each single crystal pulling apparatus. Moreover, because there may be cases in which the relationship is close to a cubic or greater curve, the relational expression may also be selected in accordance with the respective conditions.

In this manner, a relationship (i.e., a relational expression) such as that shown in FIG. 4 is specified. Next, the distance between the real image and the reflected image when the surface of the melt 2 is at the initial position of the melt surface (i.e., the desired position of the melt surface) is obtained by measuring. Based on the relationship obtained from measured values for this distance, the initial position of the melt surface (i.e., the desired position of the melt surface) is calculated, and the position of the crucible 1 is adjusted such that the position of the melt surface matches this initial position of the melt surface. For example, the difference between the initial position of the melt surface and the current position of the surface of the melt 2 is calculated, and the crucible 1 is then moved vertically by driving the drive motor 10 such that this difference changes to zero. As a result, the position of the surface of the melt 2 inside the crucible 1 is made to match the initial position of the melt surface.

The above describe processing function is incorporated in the control unit 19. Moreover, the mechanism for adjusting a melt level includes the control unit 19 that is provided with this processing function, the camera 7, the image processing unit 18, and the drive motor 10.

Next, a description will be given of a method for adjusting a melt level using this mechanism for adjusting a melt level.

Firstly, the crucible 1 in which the silicon melt 2 is held is set up inside a furnace. At this time, the position of the surface of the melt 2 is unclear. In this state, the surface of the melt 2 and the heat shield 11 are photographed by the camera 7. The surface of the melt 2 inside the crucible 1 is then moved vertically and the distances (i.e., the distances between the center point 12A and the center points 12B and 12C) between the real images 11A of the heat shield 11 and the center positions of the reflected images 11B and 11C that are reflected on the surface of the melt 2 are photographed by the camera 7 at a plurality of the movement positions to which the surface of the melt 2 has been moved (i.e., positions relative to the reference position, two positions in the graph in FIG. 4). Here, the reference position is the surface position at which the distance between the real image and the reflected images is zero. Next, the distance between the real image and the reflected image (i.e., the distance between the center point 12A of the real image 11A and the center point of the real image) is measured from the photographed image information. As a result of this method, a relationship is specified between the distance between the real image and the reflected image and the surface position of the melt 2. Next, the distance between the real image and the reflected image at the initial surface position of the melt 2 (i.e., the surface position that is being kept constant during the pulling of the single crystal, namely, the target position) is specified using the image information photographed by the camera 7. The drive motor 10 is then controlled to raise or lower the crucible 1 based on this relationship such that the difference between the surface position of the melt 2 which corresponds to the measured value of the distance between the real image and the reflected image at the target position and the actual surface position of the melt 2 inside the crucible 1 is zero. As a result, the surface position of the melt 2 inside the crucible 1 is adjusted to the initial surface position.

In this manner, instead of directly measuring the surface position of the melt 2 inside the crucible 1, the position of the surface (i.e., the melt level) of the melt 2 is determined indirectly using the distance between the real image and a reflected image of the heat shield 11, thereby enabling the surface position of the melt 2 to be correctly adjusted. Because of this, it is possible to eliminate any errors such as the installation position of the camera 7 becoming shifted. As a result, the surface of the melt 2 can be easily and accurately adjusted to a desired position. Namely, using an existing camera 7 that has been set up outside the furnace, it is possible to establish the initial surface position with a high degree of precision without making any improvements to the furnace body.

Second Embodiment

When the melt surface is moved vertically, the position of the reflected image that is observed by the camera 7 also changes. Using this fact, in the present embodiment, the position at which the heat shield 11 is in contact with the surface of the melt 2 is set as the reference position of the surface of the melt 2. The surface of the melt 2 is moved vertically, and at a plurality of points (i.e., at a plurality of surface positions of the melt 2), the respective reflected image positions are specified from the image information obtained by the camera 7. Taking the position of the real image in the image information as a reference value, a relationship between the measured values of the reflected image positions and the surface position of the melt 2 is calculated and specified. By using the relationship, the surface position of the melt 2 is adjusted.

This will now be described specifically.

The surface position of the melt 2 is moved vertically and, at a plurality of surface positions of the melt 2 (i.e., positions relative to the reference position), these respective reflected image positions are specified by the image processing unit 18 from image information obtained by the camera 7. Here, the position of the real image in this image information is taken as a reference value. Specifically, the position of the real image in the image information is taken as a reference, and the relative position of a reflected image relative to the position of the real image is measured as the position of the reflected image. Then the relationship between the measured value of the position of the reflected image and the surface position of the melt 2 is calculated and specified in the same way as in the first embodiment. Using this relationship, the surface position of the melt 2 is calculated from the measured value of the position of a reflected image and, in the same way as in the first embodiment, the surface position of the melt 2 is adjusted such that this surface position of the melt 2 is the same as the initial surface position (i.e., the desired surface position).

Third Embodiment

When the melt surface is moved vertically, the size of the reflected image that is observed by the camera 7 also changes. Using this fact, in the present embodiment, the position at which the heat shield 11 is in contact with the surface of the melt 2 is set as the reference position of the surface of the melt 2. The surface of the melt 2 is moved vertically, and at a plurality of points (i.e., at a plurality of surface positions of the melt 2), the respective reflected image sizes are specified from the image information obtained by the camera 7. Taking the size of the real image in the image information as a reference value, a relationship between the measured values of the reflected image sizes and the surface position of the melt 2 is calculated and specified. By using this relationship, the surface position of the melt 2 is adjusted.

This will now be described specifically.

At a plurality of surface positions of the melt 2 (i.e., positions thereof relative to the reference position), the sizes of the respective reflected images are measured by the image processing unit 18 from the image information obtained by the camera 7. Here, the size of the real image in the image information is taken as a reference value. Specifically, the size of the real image in the image information is taken as a reference value, and the value of the relative size of a reflected image relative to the size of the real image is measured as the size of the reflected image. The circumferential length, width, surface area and the like of the edge of the aperture portion 12 of the heat shield 11 may be used as the size of the reflected image. Then the relationship between the measured value of the size of the reflected image and the surface position of the melt 2 is calculated and specified in the same way as in the first embodiment. Using this relationship, the surface position of the melt 2 is calculated from the measured value of the size of the reflected image and, in the same way as in the first embodiment, this surface position of the melt 2 is adjusted to the initial surface position (i.e., the desired surface position).

For example, the edge of the real image or reflected image of the heat shield 11 is specified from the brightness distribution in the vertical direction or horizontal direction of the image information, and the width of the edge portion is measured as the size of the heat shield 11. If the crucible 1 is lowered, the reflected image of the heat shield 11 that is reflected on the melt surface moves away from the camera 7 and the size of this reflected image becomes smaller. If the crucible 1 is raised, the reflected image of the heat shield 11 conversely approaches the camera 7 and the size of the reflected image becomes larger. Consequently, in the same way as the case in which the distances between the real image and reflected images (i.e., the distances between the center points 12A, 12B, and 12C) are used, a relationship exists between the width of the edge of the heat shield 11 or the amount of change thereof and the surface position of the melt 2 (i.e., the amount of vertical movement). As a result, the width of the edge of the heat shield 11 can be used as an object for measurement.

However, in this case, if there is a change in the brightness that is caused by dirt or the like on the heat shield 11, measuring becomes harder and there may be cases in which it is difficult to make consistent measurements over an extended time period. Because of this, it is preferable for the width of the edge of the heat shield 11 to be used in cases in which any change in brightness due to dirt or the like does not occurs, and it is preferable for the first or second embodiment to be applied in cases in which change in brightness due to dirt or the like does occur.

In the above described first, second and third embodiments, a description is given of a mechanism for adjusting a melt level and a method for adjusting a melt level that adjust the surface of a melt 2 to an initial surface position. However, the present invention is not limited to adjusting a position to the initial surface position and may also be applied to a mechanism for adjusting a melt level and a method for adjusting a melt level that adjust the surface of the melt 2 to a desired surface position.

Moreover, the distances between the center positions of the real image and the reflected image are detected at three surface positions; however, naturally the distances may be detected at four or more surface positions. Moreover, the approximation is made using the least-square method; however, the approximation may also be made using other method such as a finite difference approximation method and the like.

The camera 7 that serves as the optical recording device 111 may be one that detects visible light or one that detects infrared light or X-ray light or the like. An optical recording device having some other structure may be used.

The points that were measured (i.e., 12A, 12B, and 12C) were found by making a circular approximation of the edge of the heat shield 11 and then taking the center point thereof; however, other points may also be used. For example, protrusions and the like may also be used. Any structure that makes it possible to accurately and reliably specify points to be measured may be used.

The amount of change (i.e., the difference) in a distance, position, or size from specified values may be determined, and then the relationship between the amount change and the surface position may be determined. For example, the distance, position, or size may be measured when the surface of the melt 2 is at the initial surface position (i.e., the desired surface position), and the amount of change from this measured value may be used. In this case, because the amount of change is obtained from the difference in measured values, measurement errors in the amount of change are compensated. Accordingly, a more precise relationship (i.e., relational expression) is obtained.

Some preferred embodiments of the invention have been described above, although these embodiments are to be considered in all respects as illustrative and not limitative. Those skilled in the art will appreciate that various additions, omissions, substitutions and other modifications are possible without departing from the scope of the invention as disclosed in the accompanying claims.

What is claimed is:

1. A mechanism for controlling an initial melt level in a single crystal pulling apparatus which controls a position of a melt surface in order to pull single crystals from the melt surface using the Czochralski method, the mechanism comprising:

an optical recording device which obtains image information by photographing a real image of a furnace internal structural object and a reflected image of the furnace internal structural object that is reflected on the melt surface in a state where a single crystal is not present; and a processing device which, taking a value that is based on the real image as a reference value, controls the position of the melt surface based on a relationship of a position of the reflected image, a size of the reflected image, a distance between the reflected image and the real image, or amounts of changes thereof to the position of the melt surface or the amount of movement of the melt surface, the relationship being calculated in advance from the image information;

wherein the furnace internal structural object is a member that is provided at a position facing the melt surface inside a crucible and is fixed such that the shape, dimensions, and position thereof remain constant and unchanged relative to the movement in the vertical direction of the crucible during the pulling of the single crystal, and the furnace internal structural object is a heat shield having a circular shape, a center point of an edge of the heat shield is calculated by a circular approximation, a center point of a reflected image of the edge of the heat shield that is reflected on the melt surface is calculated by a circular approximation, and the calculated center points are used as points for measurements in order to specify the distance between the real image and the reflected image.

2. The mechanism for controlling an initial melt level in a single crystal pulling apparatus according to claim 1, wherein, in the processing device, the position of the real image in the image information is taken as the reference value, and the position of the melt surface is controlled based on a relationship between the position of the reflected image or the amount of change thereof and the position of the melt surface or the amount of movement of the melt surface which is calculated in advance from the image information.

3. The mechanism for controlling an initial melt level in a single crystal pulling apparatus according to claim 1, wherein, in the processing device, the size of the real image in the image information is taken as the reference value, and the position of the melt surface is controlled based on a relationship of the size of the reflected image or the amount of change thereof to the position of the melt surface or the amount of movement of the melt surface which is calculated in advance from the image information.

4. The mechanism for controlling an initial melt level in a single crystal pulling apparatus according to claim 1, wherein, in the processing device, zero which is the value of the distance when the real image is in contact with the reflected image, is taken as the reference value, and the position of the melt surface is controlled based on a relationship of the distance between the real image and the reflected image or the amount of change thereof to the position of the melt surface or the amount of movement of the melt surface which is calculated in advance from the image information.

5. The mechanism for controlling an initial melt level in a single crystal pulling apparatus according to claim 1, wherein the relationship is calculated by measuring the distances and positions of the melt surface that correspond thereto in the image information at three or more positions of the melt surface, and then approximating these values to a curved line or straight line.

6. The mechanism for controlling an initial melt level in a single crystal pulling apparatus according to claim 1, wherein differential images are used when in the image information, measuring the distance between the real image of the furnace internal structural object and the reflected image that is reflected on the melt surface.

7. A method for controlling an initial melt level in a single crystal pulling apparatus which controls a position of a melt surface in order to pull single crystals from the melt surface using the Czochralski method, the method comprising:

at a plurality of movement positions of the melt surface which are positioned by moving the melt surface up and down in a state where a single crystal is not present, obtaining image information by photographing a real image of a furnace internal structural object and a reflected image thereof that is reflected on the melt surface;

taking a value that is based on the real image as a reference value, measuring a position of the reflected image, a size of the reflected image, a distance between the reflected image and the real image, or amounts of changes thereof from the image information;

calculating a relationship between the value of the measurement and a position of the melt surface or amount of movement by the melt surface;

prior to pulling a single crystal from the melt surface, obtaining image information by photographing the real image of the furnace internal structural object and a reflected image thereof, and measuring a position of the reflected image, a size of the reflected image, a distance between the reflected image and the real image, or amounts of changes thereof from the image information;

adjusting the position of the melt surface based on the relationship such that the measured values are the same as the value when the position of the melt surface is the target position; and wherein the furnace internal structural object is a member that is provided at a position facing the melt surface inside a crucible and is fixed such that the shape, dimensions, and position thereof remain constant and unchanged relative to the movement in the vertical direction of the crucible during the pulling of the single crystal, and the furnace internal structural object is a heat shield having a circular shape, a center point of n edge of the heat shield is calculated by a circular approximation, a center point of a reflected image of the edge of the heat shield that is reflected on the melt surface is calculated by circular approximation, and the calculated center points are used as points for measurement in order to specify the distance between the real image and the reflected image.

8. The method for controlling an initial melt level in a single crystal pulling apparatus according to claim 7, wherein, taking the position of the real image in the image information as the reference value, a relationship is calculated between the position of the reflected image or the amount of change thereof and the position of the melt surface or the amount of movement by the melt surface, and prior to pulling a single crystal from the melt surface, the position of the reflected image is measured from the image information, and the position of the melt surface is adjusted based on the value of the measurement and on the relationship.

9. The method for controlling an initial melt level in a single crystal pulling apparatus according to claim 7, wherein, taking the size of the real image in the image information as the reference value, a relationship is calculated between the size of the reflected image or the amount of change thereof and the position of the melt surface or the amount of movement by the melt surface, and prior to pulling a single crystal from the melt surface, the size of the reflected image is measured from the image information, and the position of the melt surface is adjusted based on the value of the measurement and on the relationship.

10. The method for controlling an initial melt level in a single crystal pulling apparatus according to claim 7, wherein, taking zero which is the value of the distance when the real image is in contact with the reflected image as the reference value, a relationship is calculated between the distance between the real image and the reflected image or the amount of change thereof and the position of the melt surface or the amount of movement by the melt surface, and prior to pulling a single crystal from the melt surface, the distance between the real image and the reflected image or the amount of change thereof is measured from the image information, and the position of the melt surface is adjusted based on the value of the measurement and on the relationship.

11. The method for controlling an initial melt level in a single crystal pulling apparatus according to claim 7, wherein the relationship is calculated by measuring the distances and positions of the melt surface that correspond thereto in the image information at three or more positions of the melt surface and then approximating these values to a curved line or straight line.

12. The method for controlling an initial melt level in a single crystal pulling apparatus according to claim 7, wherein differential images are used when in the image information measuring the distance between the real image of the furnace internal structural object and a reflected image that is reflected on the melt surface.

* * * * *